United States Patent
Ausserlechner

(10) Patent No.: US 9,268,001 B2
(45) Date of Patent: Feb. 23, 2016

(54) DIFFERENTIAL PERPENDICULAR ON-AXIS ANGLE SENSOR

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 383 days.

(21) Appl. No.: 13/944,402

(22) Filed: Jul. 17, 2013

(65) Prior Publication Data

US 2015/0022191 A1    Jan. 22, 2015

(51) Int. Cl.
| | |
|---|---|
| G01B 7/30 | (2006.01) |
| G01B 7/14 | (2006.01) |
| G01R 33/02 | (2006.01) |
| G01R 33/09 | (2006.01) |
| G01D 5/14 | (2006.01) |
| G01P 3/487 | (2006.01) |

(52) U.S. Cl.
CPC ............... *G01R 33/02* (2013.01); *G01D 5/145* (2013.01); *G01R 33/09* (2013.01); *G01R 33/096* (2013.01); *G01P 3/487* (2013.01)

(58) Field of Classification Search
CPC .......... G01D 5/145; G01B 7/30; G01P 3/487; G01R 33/09
USPC .................. 324/207.25, 207.21, 252
See application file for complete search history.

(56) References Cited

U.S. PATENT DOCUMENTS

| | | |
|---|---|---|
| 2009/0121707 A1 | 5/2009 | Schott |
| 2009/0278532 A1* | 11/2009 | Pettigrew ................. 324/207.21 |

FOREIGN PATENT DOCUMENTS

WO    WO 2008/145662    12/2008

OTHER PUBLICATIONS

W. Granig, St. Hartmann, and B. Köppl, "Performance and technology comparison of GMR versus commonly used angle sensor principles fur automotive applications," in *SAE World Congress & Exhibition*, Detroit, USA, Apr. 2007, SAE document No. 2007-01-0397.
W. Granig, J. Zimmer, Ch. Kolle, D. Hammerschmidt, B. Schaffer, R. Borgschulze, and Ch. Reidl, "Integrated Giant Magnetic Resistance based angle sensor," *Proc. of IEEE Sensors* 2006. Daegu, Korea, pp. 542-545, Oct. 2006.

(Continued)

*Primary Examiner* — Reena Aurora
(74) *Attorney, Agent, or Firm* — Schiff Hardin LLP

(57) ABSTRACT

Embodiments relate to magnetic field angle sensors, such as on-axis magnetic field angle sensors. In an embodiment, a magnetic field angle sensor comprises a magnet having an axis of rotation, and a substrate arranged in-line with the axis of rotation. A plurality, such as at least four, of magnetic field sensor elements are arranged on a surface of the substrate, spaced apart from one another in regular increments on a closed curve in an embodiment, and are sensitive to a component of a magnetic field induced by the magnet that is parallel to the surface of the substrate on which the sensor elements are arranged. Circuitry of or coupled to the sensor elements then can estimate an angular position of the magnet, such as based on the magnetic field components sensed by the sensor elements as well as positions along the closed curve where the magnetic field component vanishes in an embodiment.

20 Claims, 8 Drawing Sheets

(56) References Cited

OTHER PUBLICATIONS

Ausserlechner, U., "Inaccuracies of anisotropic magneto-resistance angle sensors due to assembly tolerances", Progr. Electromagn. Research B, vol. 40, pp. 79-99 (2012).

Demierre, M., E. Schurig, Ch. Schott, P.A. Besse, R.S. Popovic, "Contactless 360° absolute angular CMOS microsystem based on vertical Hall sensors," *Sensors and Actuators*, A 116, pp. 39-44 (2004).

Pascal J., L. Hebrard, V. Frick, "3D Hall probe integrated in 0.35 μm CMOS technology for magnetic field pulses measurements," Circuits and Systems and TAISA Conf. 2008, NEWCASTAISA 2008, Conf. Publications, pp. 97-100 (2008).

Reymond S., P. Kejik, R.S. Popovic, "True 2D CMOS integrated Hail sensor," IEEE Sensors 2007 Conf., pp. 860-863 (2007).

Takahashi, T., Y. Nagano, S. Kawahito, "Development of a High Precision Angle Sensor," NTN Techn. Rev., No. 73, 98-103. (2005).

\* cited by examiner

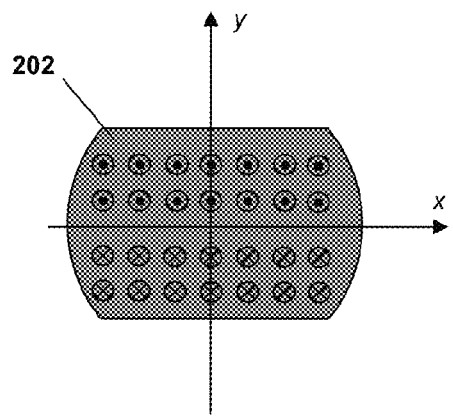
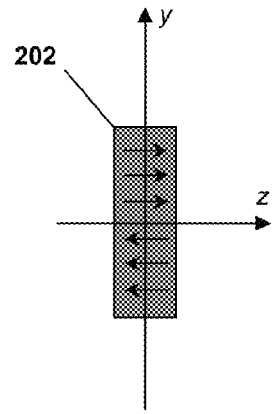
FIG. 4A
FIG. 4B
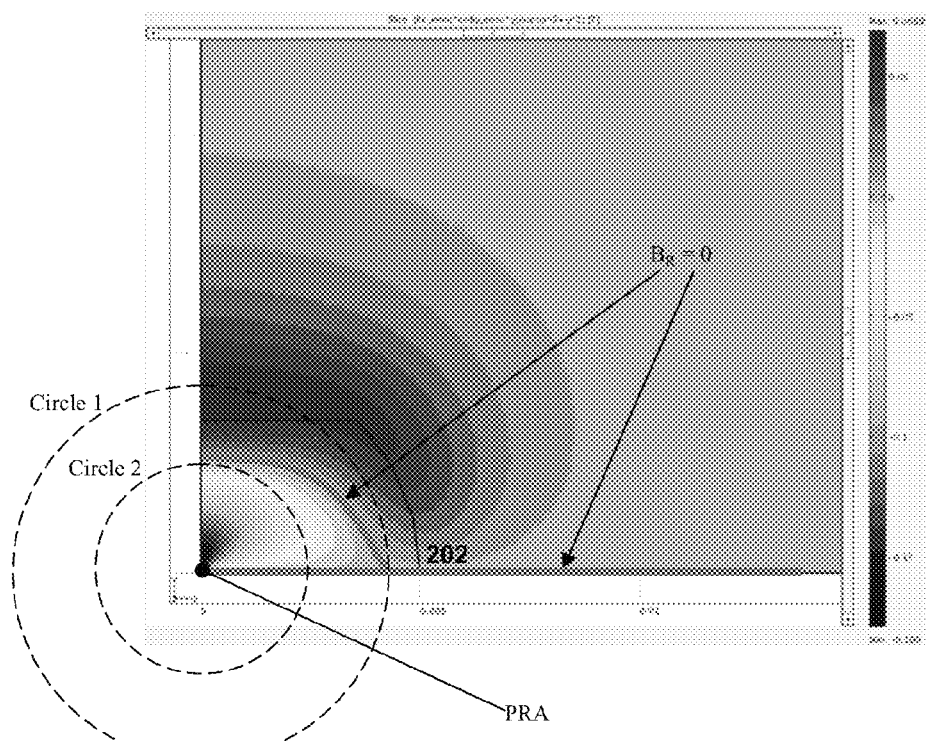
FIG. 4C

DIFFERENTIAL PERPENDICULAR ON-AXIS ANGLE SENSOR

TECHNICAL FIELD

The invention relates generally to magnetic field sensors, and more particularly to magnetic field angle sensors with generally on-axis arrangements of sensor elements relative to a rotation axis of a magnet.

BACKGROUND

Magnetic field sensors can be used to sense an angle of rotation of a shaft. For example, a magnet can be mounted on the shaft such that it rotates with the shaft, and a magnetic field sensor can be arranged proximate the magnet in order to sense a magnetic field induced by the magnet as it rotates with the shaft. When the magnetic field sensor is mounted next to or adjacent the shaft, i.e., off of the axis of rotation of the shaft, the sensor is often referred to as an "off-axis" magnetic field angle sensor. Off-axis magnetic field angle sensors often are implemented when the end of the shaft is unavailable as a location for the sensor or there simply is not space available on the shaft. An "on-axis" magnetic field sensor is one in which the sensor is mounted at or near the end of the shaft, generally in-line with or on the axis of rotation.

In many applications there is a general preference for magnetic field angle sensors, whether off- or on-axis, to be inexpensive while also being robust with respect to external magnetic fields and other disturbances. A drawback of some conventional approaches, then, is a requirement of at least two sensor substrates with sensor elements having the same magnetic sensitivity and being highly linear. While some approaches address the linearity requirement by using Hall-effect sensor elements, there could be opportunities for other, non-Hall approaches if the linearity requirement were reduced or eliminated. Many conventional approaches use stronger, and therefore more expensive magnets, which is another drawback when cost is a concern. Additionally, the accuracy of many conventional magnetic field angle sensors can be reduced if assembly tolerances are not closely controlled. In general, therefore, there are numerous drawbacks associated with conventional magnetic field angle sensors.

SUMMARY

Embodiments relate to magnetic field angle sensors and related methods and systems. In an embodiment, a magnetic field angle sensor comprises a magnet rotatable about an axis of rotation within an angular range; a substrate arranged proximate the magnet such that a projection of the axis of rotation intersects the substrate and comprising a first surface arranged perpendicularly with respect to the axis of rotation; at least three magnetic field sensor elements on the first surface of the substrate, the at least three magnetic field sensor elements distributed evenly within the angular range along a curve contained within a perimeter of the first surface and sensitive to magnetic field components parallel to the first surface of the substrate, wherein at least one of the at least three magnetic field sensor elements is sensitive to a magnetic field component of a first direction and at least one other of the at least three magnetic field sensor elements is sensitive to a magnetic field component of a second direction, the first direction being different from the second direction; and circuitry coupled to the at least three magnetic field sensor elements and configured to determine, from magnetic field components sensed by the at least three magnetic field sensor elements, at least one position along the curve where the magnetic field component is zero and to estimate an angular position of the magnet from the at least one position.

In an embodiment, a method comprises providing a magnet rotatable about an axis of rotation through an angular range; providing at least three magnetic field sensor elements proximate the magnet and regularly spaced throughout the angular range along a curve; sensing, by a first one of the at least three magnetic field sensor elements, a magnetic field component in a first direction induced by the magnet; sensing, by a second one of the at least three magnetic field sensor elements, a magnetic field component in a second direction induced by the magnet, the first direction and the second direction being not parallel and not antiparallel with one another; determining, from at least one of the magnetic field components in the first or second direction, at least one location along the curve where the magnetic field component vanishes; and estimating an angular position of the magnet from the determining.

BRIEF DESCRIPTION OF THE DRAWINGS

Embodiments may be more completely understood in consideration of the following detailed description of various embodiments of the invention in connection with the accompanying drawings, in which:

FIG. 4A is a view along a rotation axis of a quadrupole magnet according to an embodiment.

FIG. 4B is a side view of the quadrupole magnet of FIG. 4A.

FIG. 4C is a depiction of simulation results related to the magnet of FIG. 4A.

Figure 1:
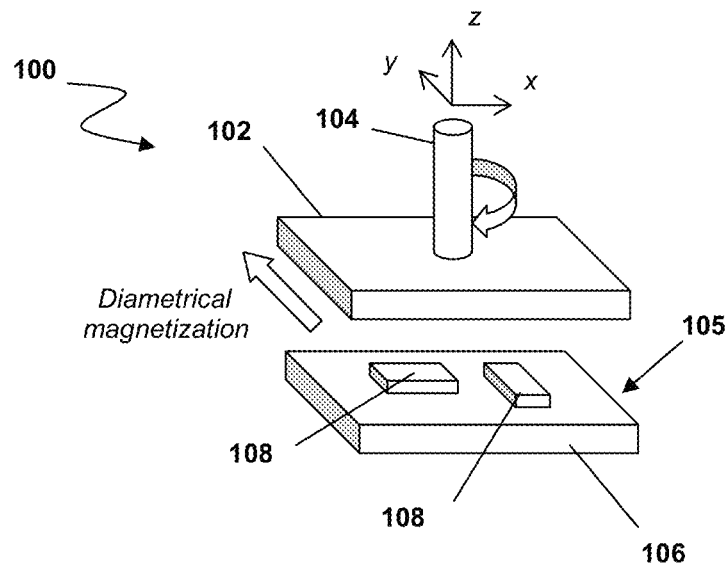
FIG. 1 is a perspective diagram of an on-axis angle sensor according to an embodiment.

While the embodiments are amenable to various modifications and alternative forms, specifics thereof have been shown by way of example in the drawings and will be described in detail. It should be understood, however, that the intention is not to be limited to any particular embodiments depicted or described. On the contrary, the intention is to cover all modifications, equivalents, and alternatives falling within the spirit and scope of the invention as defined by the appended claims.

DETAILED DESCRIPTION

Embodiments relate to magnetic field angle sensors, such as on-axis magnetic field angle sensors. In an embodiment, a magnetic field angle sensor comprises a magnet having an axis of rotation, and a substrate arranged perpendicularly to and in-line with the axis of rotation. A plurality, such as at least three, of magnetic field sensor elements, such as magnetoresistive sensor elements, are arranged on a surface of the substrate, spaced apart from one another in regular or equal increments on a curve in an embodiment, and are sensitive to a component of a magnetic field induced by the magnet that is parallel to the surface of the substrate on which the sensor elements are arranged. Circuitry of or coupled to the sensor elements then can estimate an angular position of the magnet, such as based on the magnetic field components sensed by the sensor elements as well as positions along the closed curve where the magnetic field component vanishes (i.e., is equal to zero) in an embodiment.

Referring to FIG. 1, an example of on-angle sensor 100 is depicted. Sensor 100 comprises a magnet 102 mounted or otherwise affixed to a shaft 104 such that magnet 102 rotates with shaft 104. A sensor unit 105 comprises a substrate 106 and is arranged proximate magnet 102 and shaft 104. In sensor 100, sensor unit 105 is arranged coaxially with shaft 104, with substrate 106 oriented perpendicularly thereto. Though referred to herein generally as a substrate, substrate 106 can comprise a substrate, die, circuit board or other structure in various embodiments, and use of the term substrate herein is not to be considered limiting to any particular embodiment or with respect to the claims.

A major plane of substrate 106, i.e., the xy-planar surface facing upwardly in the orientation of FIG. 1 and on which magnetic field sensor elements 108 are mounted, is arranged perpendicularly to the rotation axis of shaft 104 as illustrated. In one embodiment, two magnetic field sensor elements 108 are arranged on substrate 106, though in other embodiments discussed herein three or more sensor elements 108 generally will be used. The relative position of substrate 106 and magnet 102 can vary in embodiments, as can the relative arrangement and orientations of sensor elements 108, with FIG. 1 being exemplary of but one embodiment. For example, in other embodiments a plurality of sensor units 105 having more or fewer sensor elements 108 can be used. Moreover, FIG. 1 is not to scale and is a simplified conceptual depiction to illustrate basic components and features of an embodiment of sensor 100. Other embodiments will be discussed elsewhere herein.

Magnet 102 has a diametric magnetization in the direction indicated in FIG. 1, i.e., the y-direction, and induces a magnetic field that is perpendicular to the rotation axis of shaft 104 and magnet 102. In other embodiments, magnet 102 can be axially magnetized or comprise some other type of magnet. Sensor elements 108 are sensitive to magnetic field components which are parallel to the xy-planar surface of substrate 106 and, in embodiments, can comprise magnetoresistive (MR) sensor elements (e.g., AMR, GMR, TMR and others), giant magneto-impedance (GMI) sensor elements, Hall-effect sensor elements (e.g., vertical Hall and others) and other magnetic field sensor elements and combinations thereof.

Figure 2A:
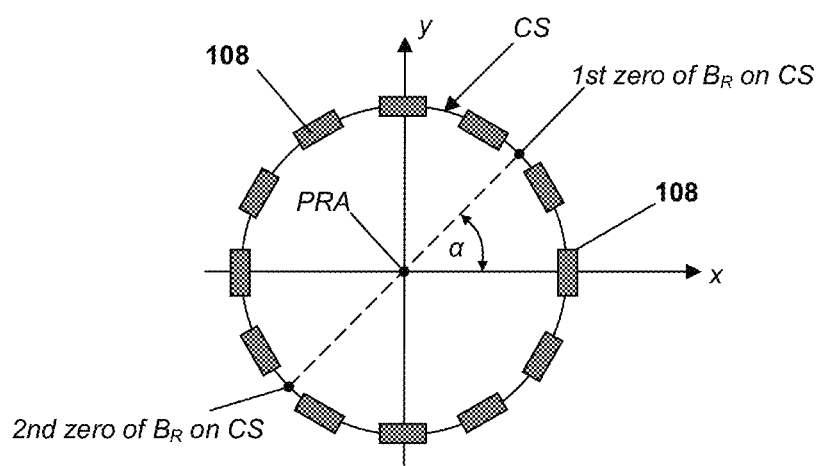
FIG. 2A is a top view diagram of a plurality of sensor elements arranged along a closed curve according to an embodiment.

Referring also to FIG. 2A, sensor 100 comprises a plurality of sensor elements 108 in embodiments, such as at least three sensor elements 108, for example twelve sensor elements 108 as depicted in this example embodiment. Sensor elements 108 can be independent sensor devices in embodiments, such that they are not coupled with other sensor elements (e.g., to form a Wheatstone bridge or other configuration). Sensor elements 108 are regularly spaced apart from one another along a closed curve CS, such as a circle in FIG. 2A or a square, oval, octagon or other shape (e.g., a polygon having at least three sides) generally having a high degree of symmetry in other embodiments. For example, sensor elements 108 can be arranged along CS in increments of 360/n, where n is the number of sensor elements. In FIG. 2A, sensor elements 108 are arranged every 360/12=30 degrees and at equal radial distances from a center point which can be aligned with a projection of the rotation axis (PRA) of shaft 104 and magnet 102. Other arrangements can be implemented in other embodiments. For example, PRA may not be exactly aligned with the center of CS in embodiments, though generally PRA will align with a point contained within the closed curve of CS. If PRA is not within CS, sensor 100 may detect background fields which are not present, fail to detect a signal or otherwise present errors.

In embodiments, the radial distance between PRA and each sensor element is in the range of about 0.1 mm to about 5 mm, and the distance can relate to the closed-curve shape of CS, as sensor elements 108 should be spaced sufficiently apart from one another to avoid interference between or among adjacent or other sensor elements 108, as this can degrade performance, though not spaced so far apart that the size of substrate 106 becomes a cost or space factor, as larger substrates typically are more expensive and could also limit applications in which a smaller size is desired or required.

In one example embodiment, the radial distance between PRA and each sensor element 108 is about 0.5 mm, such that CS has a diameter of about 1 mm centered at PRA. Magnet 102 comprises a disk, rather than a square or rectangle as in FIG. 1, having a diameter of about 10 mm and a height, or thickness, of about 3 mm and is diametrically magnetized. Magnet 102 is arranged such that the axis of the disk, which runs perpendicular to the diameter, is generally aligned or coincides with the axis of rotation of shaft 104. Additionally, in embodiments sensor elements 108 generally are at and/or experience the same temperature effects, such that any power or other devices which may generate heat which could affect performance or accuracy of sensor elements 108 are arranged symmetrically with respect to CS in embodiments, such that any effects thereof are experienced as similarly as possible by each sensor element 108.

When substrate 105 is arranged such that the xy-plane, as depicted in FIG. 2A, is perpendicular to the axis of rotation of shaft 104, the radial and azimuthal components of the magnetic field induced by magnet 102 exhibit a sinusoidal behavior with respect to the rotation angle on sensor elements 108. While the exact shape of the sinusoidal curve can be considered irrelevant, it will have two zero-crossings along the curve CS, which is useful in embodiments for estimating and/or determining an angle of rotation. Only a single zero-crossing would not enable cancelation of homogenous background fields, which more than two zero-crossings would introduce angular ambiguity over 360 degrees of rotation.

Figure 3A:
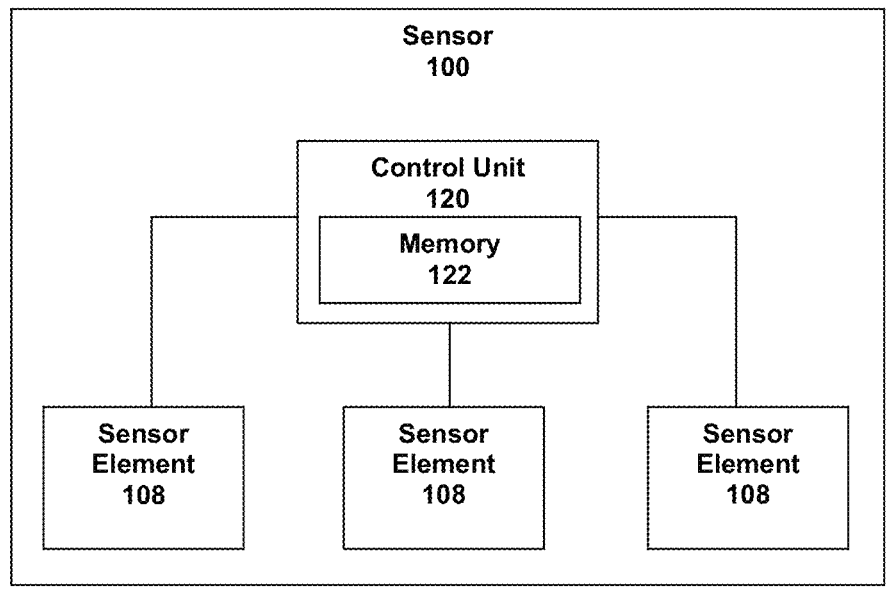
FIG. 3A is a block diagram of a sensor according to an embodiment.
Figure 3B:
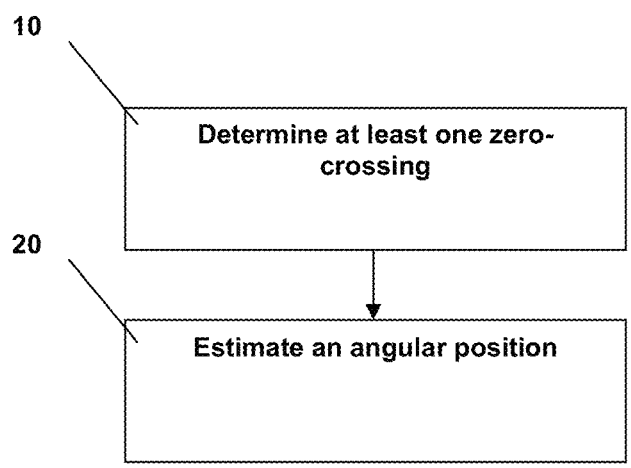
FIG. 3B is a flowchart according to an embodiment.

Thus, in an embodiment and referring also to FIGS. 3A and 3B, sensor 100 or circuitry coupled thereto senses these magnetic field components and identifies the locations of the zero-crossings along the curve CS. Sensor 100 can comprise a control unit 120 comprising or coupled to memory circuitry 122. In another embodiment, control unit 120 and/or memory circuitry 122 can be external but coupled to sensor 100, and/or memory circuitry 122 can be external to control unit 120, with the depiction in FIG. 3 being exemplary of but one embodiment. Moreover, sensor 100 can comprise more or fewer components than are depicted in the simplified block diagram of FIG. 3. In embodiments, control unit 120 can determine the zero-crossings from sensor elements 108 at 10, and from at least one of the zero-crossings estimate an angular position of magnet 102 at 20.

Returning to FIG. 2A, example first and second zero-crossings are illustrated. If the zero-crossings are 180 degrees apart, i.e., a straight line can be drawn between them and through PRA as illustrated by the dashed line in FIG. 2A, a negligible or no undesirable background magnetic field disturbance is present, and the rotational position can be determined from the angle between that line and the x-axis (shown as α in FIG. 2A), plus some arbitrary fixed angle in embodiments (e.g., 90 degrees). For example, if magnet 102 is mounted 90 degrees from some reference direction, sensor 100 must add 90 degrees to its readings in order to take this into consideration for an accurate output.

Figure 2B:
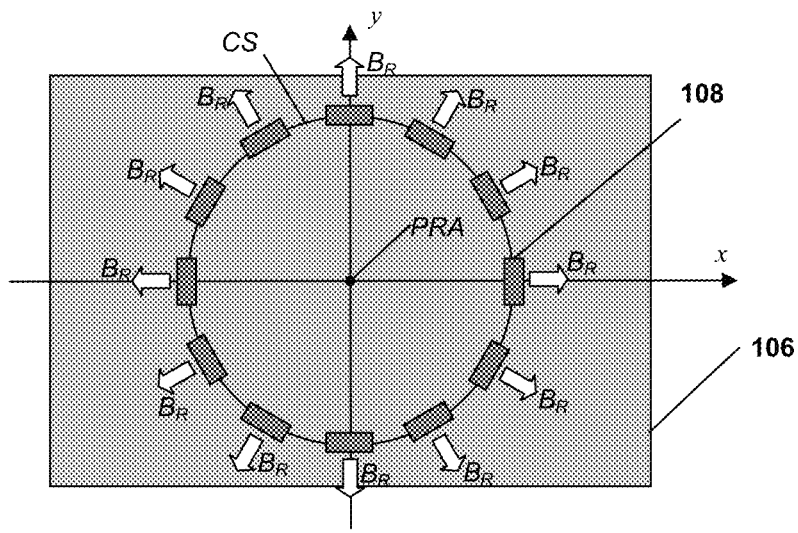
FIG. 2B is a top view diagram of a plurality of sensor elements arranged along a closed curve on a substrate according to an embodiment.
Figure 2C:
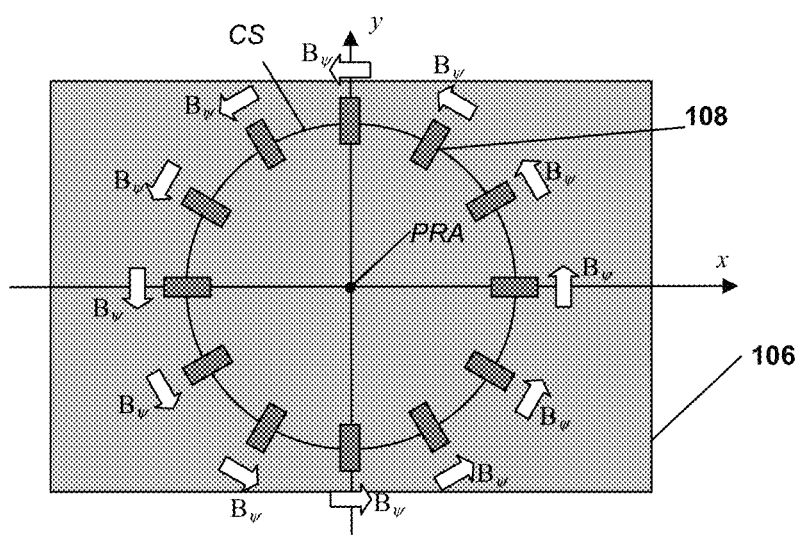
FIG. 2C is a top view diagram of a plurality of sensor elements arranged along a closed curve on a substrate according to an embodiment.

In embodiments, sensor elements 108 can detect radial magnetic field components (FIG. 2B) or azimuthal (e.g., tangential) magnetic field components (FIG. 2C). In FIG. 2B, sensor elements 108 comprising MR (e.g., AMR), vertical Hall or other suitable magnetic field sensor elements are arranged similarly to those of FIG. 2A, along a curve CS, which is in this embodiment a closed-curve circle but can vary in other embodiments as discussed elsewhere herein. Sensor elements 108 are arranged at 30-degree increments (n=12) and are equally spaced from center point PRA, which can be aligned with the axis of rotation of shaft 104 and magnet 102, also as previously discussed. The radial magnetic field component $B_R$ to which each sensor element 108 can be sensitive is shown by the white arrows.

In FIG. 2C, sensor elements 108 are rotated 90 degrees with respect to their orientation in FIG. 2B and can be sensitive to the azimuthal or tangential magnetic field component $B_\Psi$, shown by the white arrows. While sensor elements 108 are also spaced apart here by 30 degrees, adjacent sensor elements 108 can be viewed as being rotated by 30 degrees with respect to each other in this embodiment. In other embodiments, this degree of rotation between adjacent sensor elements 108 can vary, with sensor elements 108 then being sensitive to some linear combination of radial and azimuthal components. For example, adjacent sensor elements 108 can be rotated by 45 degrees with respect to one another, or 137.9 degrees, or some other angle. In these and other embodiments, curve CS, in other words the overall arrangement of sensor elements 108 on substrate 106, can comprise a square or rectangle instead of a circle, or some other generally closed curve as discussed elsewhere herein.

Additional features and characteristics can vary in embodiments from those depicted as examples in FIGS. 2A-2C. For example, in embodiments some or all of sensor elements 108 can be electrically coupled, such as to form a Wheatstone bridge or other configuration. In other embodiments, an arrangement which includes some sensor elements 108 arranged to be sensitive to radial magnetic field components and other sensor elements 108 arranged to be sensitive to azimuthal magnetic field components, simultaneously, can be implemented. In embodiments comprising at least three sensor elements 108, at least one of the sensor elements 108 can be sensitive to a magnetic field component in a first direction and at least one other of the sensor elements 108 can be sensitive to a magnetic field component of a second direction, the first direction being different from the second direction. For example, in one embodiment the first direction is neither parallel nor antiparallel (i.e., in an opposite direction) with the second direction. As discussed elsewhere herein, the zero-crossings of $B_R$ and $B_\Psi$ should be shifted with respect to each other by 90 degrees along the CS curve. Such an embodiment could be used, e.g., as an additional operational test of sensor 100, such as for functional safety reasons.

In still other embodiments, magnet 102 can vary from embodiments depicted and/or discussed herein above, e.g., the cylindrical configuration discussed with reference to FIGS. 2A-2C. For example, and referring to FIGS. 4A and 4B, magnet 102 comprises an axial quadrupole 202 in embodiments, in which the varying magnetization is illustrated using a conventional magnetic field notation. Though the size, shape and other characteristics can vary in embodiments, in one embodiment the y-dimension of magnet 202 (e.g., the height as depicted on the page in FIGS. 4A and 4B) is about 7 mm, the x-dimension (e.g., the width as depicted on the page in FIG. 4A) is about 10 mm, and the z-dimension (e.g., the thickness as depicted on the page in FIG. 4B) is about 3 mm.

FIG. 4C shows simulation results for magnet 202, with only one quadrant (x>0, y>0) of magnet 202 depicted, with respect to sensor elements 108 responsive to radial magnetic field components induced thereby. Two curves where the radial magnetic field component $B_R=0$ are shown and can be used to determine an arrangement of sensor elements 108 on closed-curve CS. As previously discussed, it is desired that there are two zero-crossings of $B_R$ in embodiments, in order for sensor 100 to estimate and/or determine the rotational position of the magnet, in this embodiment magnet 202. As can be seen in FIG. 4C, then, there are two general options for the arrangement of CS with respect to magnet 202: within Circle 2, or outside of Circle 1, as these are the regions in which there are two $B_R$ zero crossings in a single revolution of magnet 202.

Figure 4D:
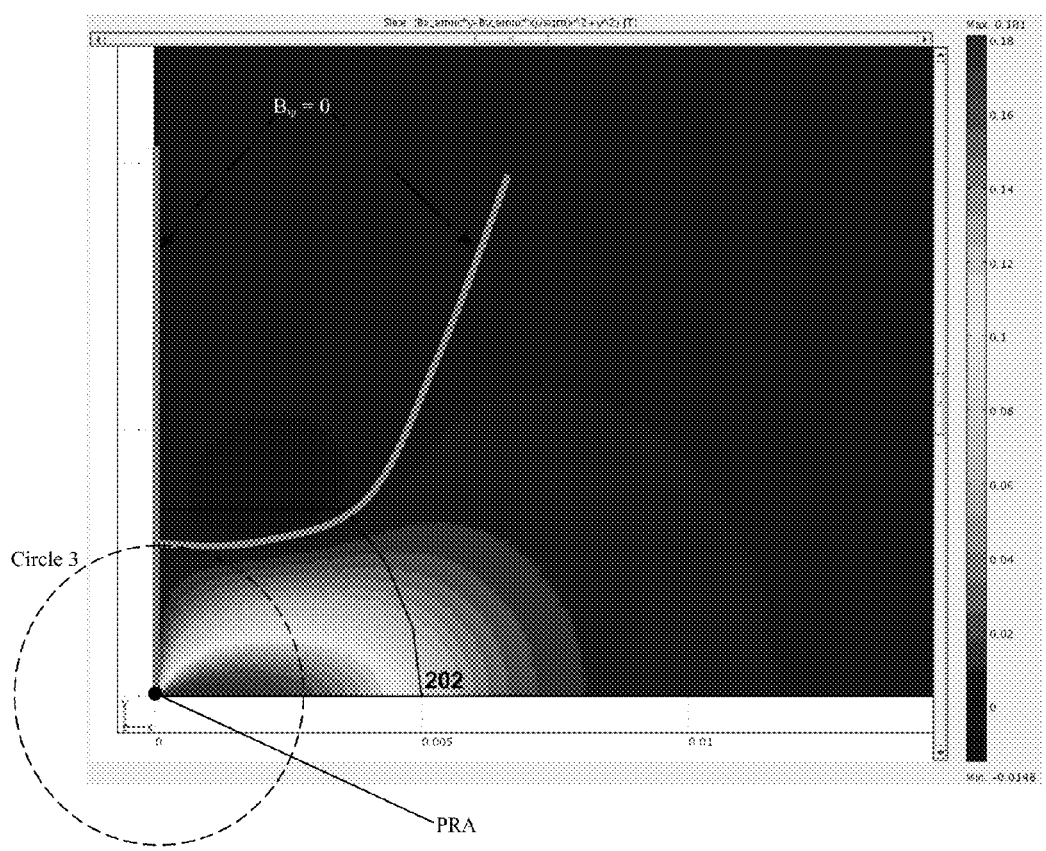
FIG. 4D is a depiction of simulation results related to the magnet of FIG. 4A.

FIG. 4D shows a similar simulation result for sensor elements 108 responsive to the azimuthal magnetic field components induced by magnet 202. In such an embodiment, closed-curve CS should be configured and arranged relative to magnet 202 such that it is within Circle 3. Again, this will provide two $B_\Psi$ zero crossings in a single revolution of magnet 202.

Figure 5A:
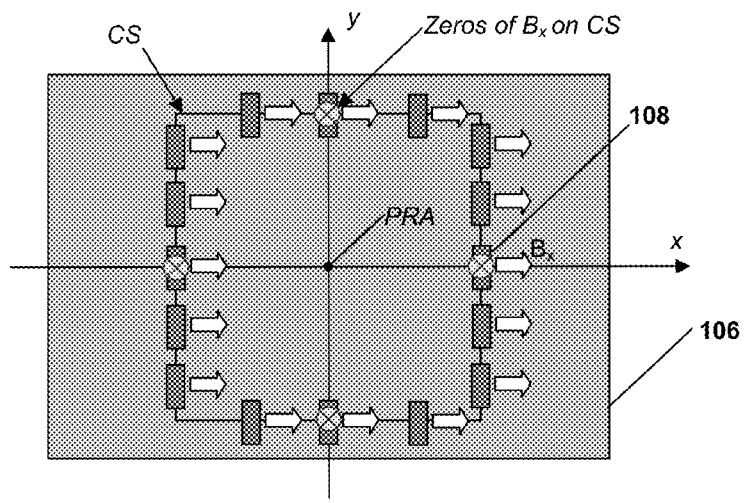
FIG. 5A is a top view diagram of a plurality of sensor elements arranged along a closed curve on a substrate according to an embodiment.

Returning, then, to example configurations and arrangements of closed-curve CS and sensor elements 108, FIGS. 5A-5E depict various embodiments. These various embodiments, which are not limiting, depict various configurations of sensor elements 108 which take into consideration the sensitivity directions of the sensor elements 108. In FIGS. 5A-5E, plan views of the xy-plane of sensor substrate 106, on which sensor elements 108 are arranged, are depicted. Unless otherwise mentioned, magnet 102 (though magnet 202 or some other embodiment of a magnet also can be used) is uniformly and diametrically magnetized in the y-direction as oriented in the figures. Then, the $B_x$ magnetic field component on the surface of substrate 106 is proportional to the product of x and y. Therefore, using all sensor elements 108 sensitive to $B_x$, as is depicted in FIG. 5A, or another fixed direction in the xy-plane generally will not work because more than two zero-crossings on the closed-curve CS will be detected, and as discussed herein only two are desired in embodiments. The four zero-crossings of this embodiment are depicted in FIG. 5A.

While generally square or rectangular closed-curves CS are depicted in FIGS. 5A-5E, other curve shapes can be used in these and other embodiments. For example, a generally circular closed-curve CS could also be used in an embodiment. Other shapes and configurations also are possible, consistent with other discussion herein. In each of FIGS. 5A-5E, the projection of the rotation axis, or PRA is on substrate 106, within closed-curve CS (and, as depicted, generally at the center of closed-curve CS).

Figure 5B:
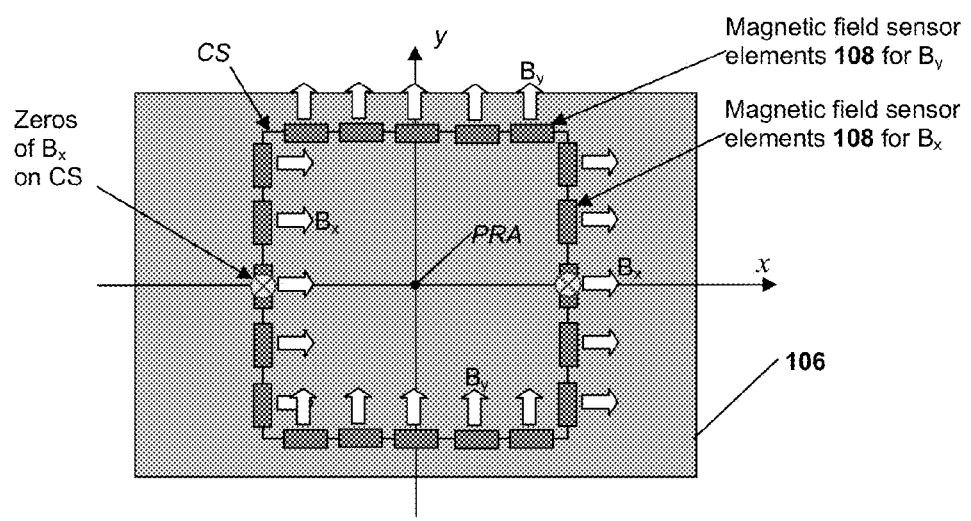
FIG. 5B is a top view diagram of a plurality of sensor elements arranged along a closed curve on a substrate according to an embodiment.

In contrast, FIG. 5B depicts some sensor elements 108 which are sensitive to the $B_x$ magnetic field component (e.g., those arranged on the left and right sides of closed-curve CS as depicted on the page) and others 108 which are sensitive to the $B_y$ magnetic field component (e.g., those arranged on the top and bottom sides of closed-curve CS as depicted in the page). In this embodiment, only two zero-crossings occur along closed-curve CS, as shown, as the $B_x$ field component of a diametrical magnet has two zero-crossings, and the $B_y$ field has none.

Figure 5C:
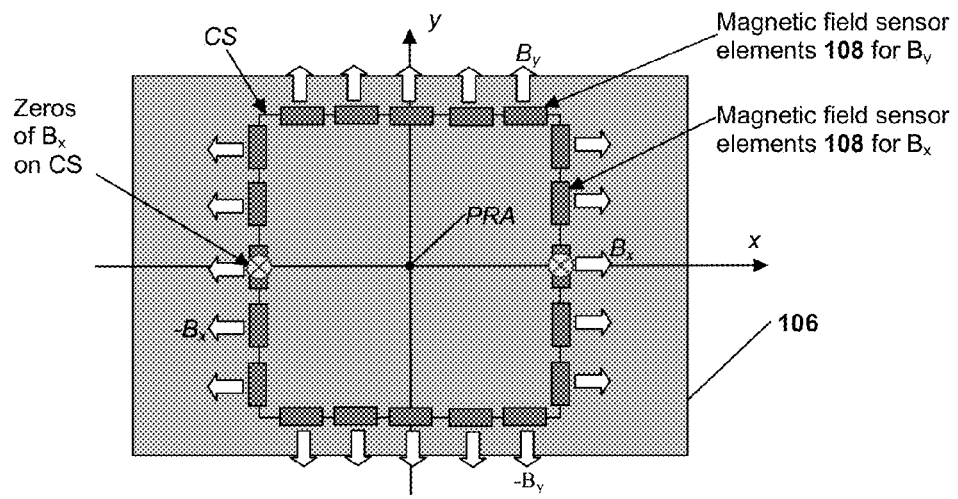
FIG. 5C is a top view diagram of a plurality of sensor elements arranged along a closed curve on a substrate according to an embodiment.

In FIG. 5C, an arrangement in which the two zero-crossing signals are inverted with respect to each other is depicted. Such a configuration can be more robust, as the signals are actual zero-crossings, rather than merely touching the zero-crossing as can occur in other embodiments. As can be seen, sensor elements 108 on the left side of substrate 106 are sensitive to negative ($-B_x$) field components, while those 108 on the right side of the substrate are sensitive to positive ($B_x$) field components. A similar arrangement is used for the $B_y$-sensitive sensor elements 108 on the top ($B_y$) and the bottom ($-B_y$).

Figure 5D:
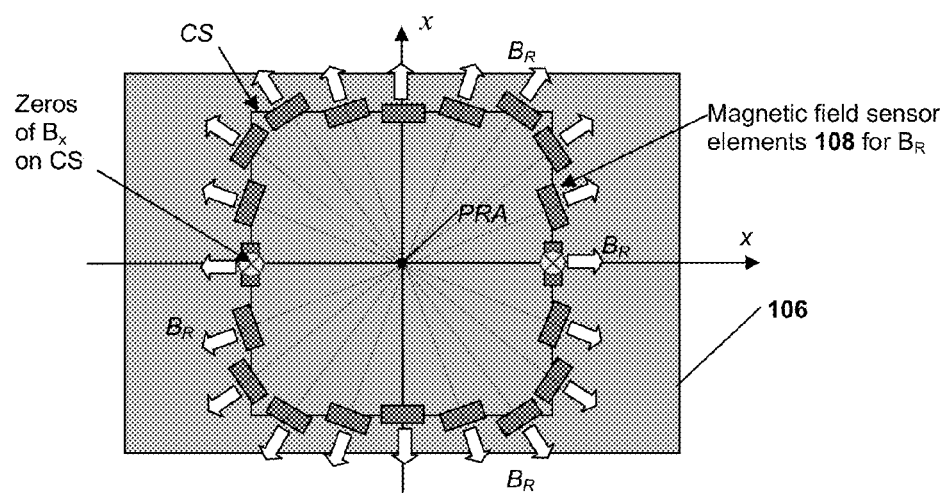
FIG. 5D is a top view diagram of a plurality of sensor elements arranged along a closed curve on a substrate according to an embodiment.

FIG. 5D depicts an embodiment in which sensor elements 108 are sensitive to radial $B_R$ magnetic field components. Sensor elements 108 are again arranged on a generally square or rectangular closed-curve CS, though as can be seen adjacent sensor elements 108 are generally rotated with respect to one another. There are two zero-crossings along the x-axis, and similar to FIG. 5C, the signals are inverted at the zero-crossings, which can provide for a more robust signal.

Figure 5E:
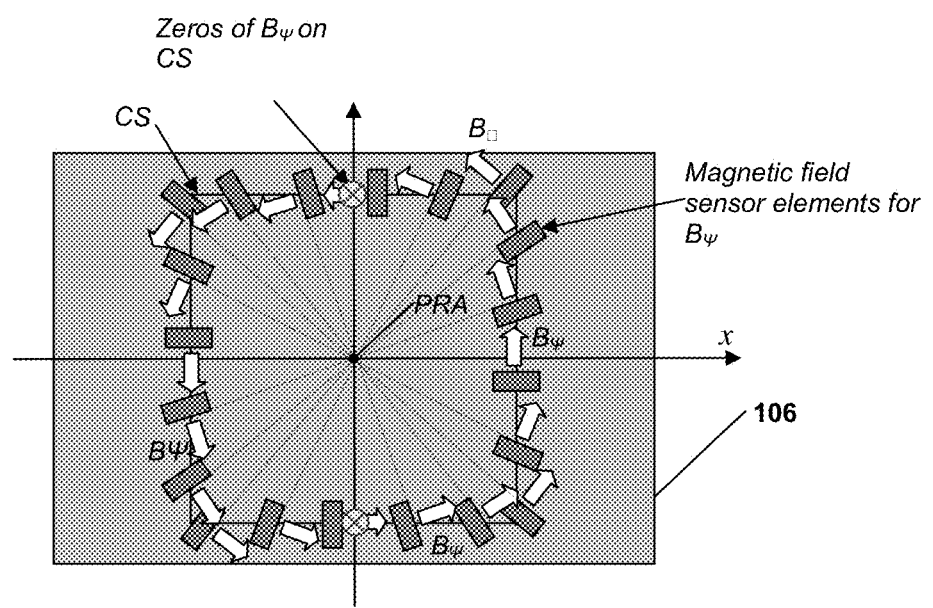
FIG. 5E is a top view diagram of a plurality of sensor elements arranged along a closed curve on a substrate according to an embodiment.

FIG. 5E depicts an embodiment in which sensor elements 108 are sensitive to azimuthal $B_\psi$ magnetic field components. Similar to FIG. 5D, sensor elements 108 are again arranged on a generally square or rectangular closed-curve CS, though as can be seen adjacent sensor elements 108 are generally rotated with respect to one another. There are two zero-crossings along the y-axis, and similar to FIGS. 5C and 5D, the signals are inverted at the zero-crossings, which can provide for a more robust signal.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetic field angle sensor comprising:
   a magnet rotatable about an axis of rotation within an angular range;
   a substrate arranged proximate the magnet such that a projection of the axis of rotation intersects the substrate and comprising a first surface arranged perpendicularly with respect to the axis of rotation;
   at least three magnetic field sensor elements on the first surface of the substrate, the at least three magnetic field sensor elements distributed evenly within the angular range along a curve contained within a perimeter of the first surface and sensitive to magnetic field components parallel to the first surface of the substrate, wherein at least one of the at least three magnetic field sensor elements is sensitive to a magnetic field component of a first direction and at least one other of the at least three magnetic field sensor elements is sensitive to a magnetic field component of a second direction, the first direction being different from the second direction; and
   circuitry coupled to the at least three magnetic field sensor elements, the circuitry configured to:
      determine, from magnetic field components sensed by the at least three magnetic field sensor elements, at least one position along the curve where the magnetic field component is zero; and
      estimate, based on the at least one position, an angular position of the magnet.

2. The magnetic field angle sensor of claim 1, wherein the first direction and second direction are not parallel and are not antiparallel.

3. The magnetic field angle sensor of claim 2, wherein no pair of the at least three sensor elements is sensitive to magnetic fields components in the same direction.

4. The magnetic field angle sensor of claim 1, wherein the angular range is 360 degrees and the curve comprises a closed curve.

5. The magnetic field angle sensor of claim 4, wherein the closed curve comprises one of a circle, or a polygon having at least three sides.

6. The magnetic field angle sensor of claim 5, wherein the circuitry is configured to determine at least two positions along the closed curve where the magnetic field component is zero and to estimate the angular position of the magnet from the at least two positions.

7. The magnetic field angle sensor of claim 4, wherein the projection of the axis of rotation intersects the substrate within the closed curve.

8. The magnetic field angle sensor of claim 7, wherein the projection of the axis of rotation is proximate a center point of the at least three magnetic field sensor elements.

9. The magnetic field angle sensor of claim 1, wherein the at least three magnetic field sensor elements comprise magnetoresistive (MR) sensor elements.

10. The magnetic field angle sensor of claim 9, wherein the at least three magnetic field sensor elements comprise anisotropic MR (AMR) sensor elements.

11. The magnetic field angle sensor of claim 1, wherein the at least three magnetic field sensor elements are sensitive to magnetic field components parallel to a radial direction.

12. The magnetic field angle sensor of claim 11, wherein the projection of the axis of rotation intersects the substrate at a center of all radial directions.

13. The magnetic field angle sensor of claim 1, wherein the at least three magnetic field sensor elements are sensitive to magnetic field components parallel to an azimuthal direction.

14. The magnetic field angle sensor of claim 13, wherein the projection of the axis of rotation intersects the substrate at a center of all azimuthal directions.

15. A method comprising:
providing a magnet rotatable about an axis of rotation through an angular range;
providing at least three magnetic field sensor elements proximate the magnet and regularly spaced throughout the angular range along a curve;
sensing, by a first one of the at least three magnetic field sensor elements, a magnetic field component in a first direction induced by the magnet;
sensing, by a second one of the at least three magnetic field sensor elements, a magnetic field component in a second direction induced by the magnet, the first direction and the second direction being not parallel and not antiparallel with one another;
determining, by circuitry based on at least one of the magnetic field components in the first or second direction, at least one location along the curve where the magnetic field component vanishes; and
estimating, based on the at least one location, an angular position of the magnet.

16. The method of claim 15, further comprising sensing, by at least one more of the at least three magnetic field sensor elements, a magnetic field component induced by the magnet.

17. The method of claim 15, wherein the determining further comprises determining at least two locations along the curve where the magnetic field component vanishes.

18. The method of claim 15, wherein the providing further comprises providing at least three magnetic field sensor elements proximate the magnet and regularly spaced throughout the angular range along a closed curve.

19. The method of claim 15, further comprising providing an output signal related to the estimating.

20. The method of claim 15, further comprising causing the magnet and the at least three magnetic field sensor elements to rotate relative to one another.

* * * * *